United States Patent
Fenton et al.

(10) Patent No.: US 6,490,694 B1
(45) Date of Patent: Dec. 3, 2002

(54) ELECTRONIC TEST SYSTEM FOR MICROPROCESSOR BASED BOARDS

(75) Inventors: William Fenton, Co. Donegal (IE); Patrick Nee, Co. Donegal (IE)

(73) Assignee: Formia, Ltd. (IE)

( * ) Notice: Subject to any disclaimer, the term of this patent is extended or adjusted under 35 U.S.C. 154(b) by 0 days.

(21) Appl. No.: 09/295,224

(22) Filed: Apr. 19, 1999

(30) Foreign Application Priority Data

Apr. 17, 1998 (IE) .............................................. S980293

(51) Int. Cl.[7] .......................... H02H 3/05; G01R 31/28; G11C 29/00

(52) U.S. Cl. ............................ 714/25; 714/28; 714/42; 714/712; 714/719; 324/528; 324/531

(58) Field of Search .......................... 714/730, 42, 712, 714/719, 726, 736, 724, 741, 32, 28, 734; 379/1, 10, 27, 29; 324/72.5, 538, 754, 415, 528, 531; 702/118; 37/9.06, 17

(56) References Cited

U.S. PATENT DOCUMENTS

| | | | | |
|---|---|---|---|---|
| 4,342,957 A | * | 8/1982 | Russell | 324/72.5 |
| 4,455,654 A | * | 6/1984 | Bhaskar et al. | 714/28 |
| 4,516,076 A | * | 5/1985 | Pilari et al. | 324/418 |
| 4,575,792 A | * | 3/1986 | Keeley | 714/42 |
| 4,622,647 A | * | 11/1986 | Sagnard et al. | 702/118 |
| 4,794,599 A | * | 12/1988 | Purcell et al. | 714/719 |
| 5,504,753 A | * | 4/1996 | Renger et al. | 714/712 |

* cited by examiner

Primary Examiner—Emmanuel L. Moise
(74) Attorney, Agent, or Firm—Rossi & Associates

(57) ABSTRACT

A method and apparatus for use with an electronic test system to enable the direct testing of buses on a unit under test (UUT). A connection and interface for an electronic test system are provided, which are simple to use, fast to connect and reliable, which may be used as an extra point of test and/or for testing buses remote from the microprocessor of a circuit under test, and which may also be used independently of any devices of the circuit under test. The test apparatus and method may be used to test buses remote from the microprocessor without the use of peripheral devices on the circuit under test, for example I/O chips.

25 Claims, 4 Drawing Sheets

ELECTRONIC TEST SYSTEM FOR MICROPROCESSOR BASED BOARDS

FIELD OF THE INVENTION

This invention relates to electronic test systems for testing microprocessor based circuits. In particular, the invention relates to electronic test systems having a interface device for providing a test connection on a circuit under test at a location remote from microprocessor and memory devices.

BACKGROUND OF THE INVENTION

Electronic test systems are frequently used in the development, manufacture and repair of electronic circuits. In a simple electronic test system, one or more test signals are applied to a unit under test (UUT) and the response of the unit is measured at one or more locations. Potential faults may be identified by comparing the responses obtained from the circuit under test with those of an ideally functioning circuit. For testing microprocessor systems, a number of methods are available. These methods include:
1. "Scope and grope testing",
2. ROM (Read Only Memory) emulation,
3. Microprocessor emulation using cycle stealing, and
4. Microprocessor testing using the debug port of the processor.

In "scope and grope" testing, a technician determines the location or nature of a fault using one or more of a multiplicity of techniques, including for example continuity testing. In doing so, the technician isolates problems or faults using a combination of skill, experience, persistence and luck, but without the assistance of any automated testing. Particularly with complex boards such as microprocessor baseboards, this type of testing is time consuming, requires experienced technicians and, in most situations, is uneconomic.

With ROM emulation, the boot-up ROM is replaced by a ROM emulator circuit. The boot-up ROM contains the initialising program to be run by a microprocessor each time it is switched on or reset. The ROM emulation circuit also provides a microprocessor with a program, but the program is designed as a diagnostic program rather than as a strict initialising program. Responses of the microprocessor and circuit to this program can be measured at various locations in the circuit. Typically, these ROM emulation circuits return test result information through the emulation circuit. This test information is processed by a computer for viewing on screen or for automatic highlighting of potential failures.

EP-A-0,191,632 describes the use of a method for returning data through the emulation circuit, wherein logic circuitry in the ROM emulator permits test data to be read over the system address bus (the data bus cannot be used in this instance since data cannot be written to a ROM device). If the area of the circuit under test between the microprocessor and the boot ROM is defective, then ROM emulation will not work.

U.S. Pat. No. 4,622,647 discloses a gripper for use in conjunction with ROM emulation circuits. The gripper is connectable to a microprocessor and permits measurement of logic signals at the terminals of the microprocessor. This method does not necessarily rely on a diagnostic program in the ROM emulation circuit to return data, but typically does require such a program in order to run a test. The method described provides reliable data only from the microprocessor. The reliability of data from other locations relies on the integrity of components and connections, while in addition, the reliability of gripper connections is typically not high and false indications of errors are likely to occur frequently due to bad connections.

In microprocessor emulation using cycle stealing, as described in EP-A-0,067,510, the microprocessor in the circuit under test is replaced by a test circuit containing a similar microprocessor. To achieve this, the circuit microprocessor must be removed or disabled. Where a socket has been used to house the microprocessor, this is a simple matter. However, more commonly, microprocessors are soldered onto boards and with pin counts often of the order of several hundred, the removal of a microprocessor becomes difficult. Some chips permit an alternative method of disabling a chip by switching a particular input to a specific state. Typically this is achieved by placing a test clip over the processor. During testing, the test device interrupts the unit under test, injects a read or write cycle, collects the result, and then removes itself (logically not physically) from the buses of the unit under test. In addition, where the microprocessor has been disabled, rather than removed, a gripper or similar feature must be connected on top of the processor so as to connect with all the pins on the microprocessor. This is a troublesome method, and frequently failures will be highlighted by the test system arising not from a fault in the circuit under test but from a faulty connection between the gripper and microprocessor. A further disadvantage of these microprocessor emulation systems is that the microprocessors must be removed from the units under test or disabled. As a result, a key element of the circuit is not being tested.

Microprocessor testing using the debug port is a method only available for use with certain types of microprocessors, i.e. those that have a debug port. In this method, the test system connects directly to the processor in the unit under test via the processors debug port. The electronic test system may connect to the debug port via either a port connector on the unit under test or an interposer card which sits between the processor and its socket. An advantage of this method is that the test system need only connect to a small number of pins on the microprocessor. Accordingly the possibility of an error arising from a poor connection with the test system is reduced.

Using the above mentioned microprocessor testing methods, a variety of tests may be performed on a system, examples of which include BUS tests, ROM tests and DRAM tests. A significant disadvantage of the above test systems is that they can only test the circuits under test at the location of the ROM or processor. Other areas of the circuit cannot be tested directly.

Irish Patent Application No. 1576/89 discloses the use of a probe with a ROM emulation system. The probe enables signals to be detected at various locations around a circuit and returned for display on a computer system along with the results of the ROM emulation circuit. Thus faults can be localised, once they have been highlighted by s another test method. In testing, the probe may be positioned by hand at the correct location and repositioned as required. This is useful where a single track is faulty, and the probe is used to find that track or the location on a track of a fault.

Modern microprocessor circuit architectures are frequently arranged in a hierarchical structure, as illustrated in FIG. 1, with different layers of the hierarchy operating at different speeds. Using the above methods, it is difficult to test the operation of such a circuit simply using one or more of the above methods. In particular, problems can arise in attempting to automatically test and diagnose the lower bus layers.

One method of testing the lower bus layers of a unit under test, using ROM or microprocessor emulation, is to write a pattern of data to an address location on a device/chip connected to a lower bus layer. If the same address location when read back returns a different pattern of data, then this indicates a fault.

One difficulty using this technique is that the test may have to be changed for each make and model of device/chip used on a board, as for example each device may have different read/write addresses. This will require a not insignificant amount of work, and reprogramming of a test system by an experienced technician.

Modern computer systems commonly feature a plug-and-play facility. This facility allows a computer to accept a variety of add-on cards/devices, e.g. sound cards, I/O chips etc., without the user having to specify the addressing and interrupt requirements for each device. Upon start-up of a computer possessing this plug-and-play facility, all the devices and cards are initially left powered down (sleep mode). The computer then powers up each device individually, determines that device's addressing and interrupt requirements, and then powers it down. Once the microprocessor has determined all of the attached devices requirements, it assigns addresses and interrupts to each device, ensuring there are no conflicts. The individual devices are then powered up and normal operation of the computer commences.

This plug-and-play facility can cause problems when attempting to test buses remote from the microprocessor. In particular, when using the above mentioned method of writing a data byte and then reading it back from a device, the device may not power up because of a fault either in the device or on the bus. As a result, a technician will have t o use a probe or other means to isolate the fault, which is time consuming.

SUMMARY OF THE INVENTION

The se shortcomings and others are addressed and sub-stantially overcome by the present invention, which provides a method and apparatus for use with an electronic test system to enable the direct testing of buses on a unit under test (UUT). More specifically, a connection and interface for an electronic test system are provided, which are simple to use, fast to connect and reliable, which may be used as an extra point of test and/or for testing buses remote from the microprocessor of a circuit under test, and which may also be used independently of any devices of the circuit under test. The test apparatus and method may be us ed to test buses remote from the microprocessor without the use of peripheral devices on the circuit under test, for example I/O chips.

In accordance with one embodiment of the invention, an interface device is provided for use with an electronic test system for testing circuits including a processor. The interface device comprises control means, first communicating means for communicating between the control means and the electronic test system, and second communicating means for communicating between the control means and a circuit under test. The control means is responsive to instructions from command means of the electronic test system to communicate data to or from the circuit under test, and the second communicating means comprises means for enabling access to a bus of the circuit under test. The bus access-enabling means preferably comprises connection means for connecting to a bus of the circuit under test, while the connection means comprises a bus slot connector. The control means may comprise a data capture circuit, and may be implemented as at least one FPGA.

In accordance with another embodiment of the invention, a method of testing an electronic circuit including a microprocessor is provided. The method comprises the steps of generating a test signal, applying the test signal to a first location of the circuit under test, and measuring the response of the circuit under test to the test signal at a location of the circuit under test different from the first location, wherein at least one of the locations enables access to a bus of the circuit under test. Preferably, the test signal is applied via a ROM emulation circuit, or, in an alternative embodiment, the test signal may be applied via a microprocessor emulation circuit.

In accordance with yet another aspect of the invention, the step of measuring the response further comprises measuring the response at connecting means for connecting to a bus of the circuit under test. The connecting means may comprise a bus slot connector. The method may further comprise processing the response for display of test results, wherein the processing of the response is implemented at least in part by at least one FPGA.

In still another form of the invention, electronic test apparatus is provided for testing an electronic circuit including a microprocessor. The electronic test apparatus comprises at least first and second means enabling access to a circuit under test, means for generating a test signal, means for applying the test signal to the first access-enabling means, and means for measuring, at the second access-enabling means, the response of the circuit under test to the test signal applied at the first access-enabling means. At least one of the access-enabling means enables access to a bus of the circuit under test.

Preferably, one of the first and second access-enabling means comprises connection means for connecting to the circuit under test. The connection means may comprise a ROM emulation circuit, or, in the alternative, a microprocessor emulation circuit. The first access-enabling means may comprise connection means, where the connection means is alternatively a ROM emulation circuit or a microprocessor emulation circuit.

In still another form of the invention, the second access-enabling means comprises connection means for connecting to a bus of the circuit under test, wherein the connection means comprises a bus slot connector. The second access-enabling means may comprise control means, which may in turn comprise a data capture circuit. The control means is preferably implemented as at least one FPGA.

Further objects, features, and advantages of the present invention will become apparent from the following description and drawings.

BRIEF DESCRIPTION OF THE DRAWINGS

The invention will now be described in more detail having regard to the accompanying drawings, in which.

DETAILED DESCRIPTION OF THE DRAWINGS

Figure 1:
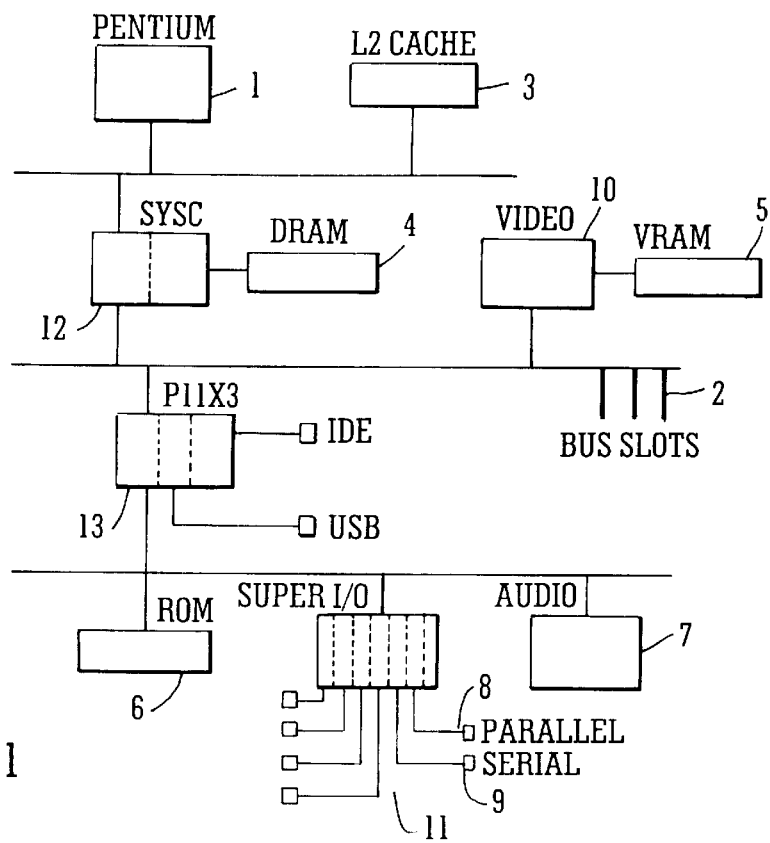
FIG. 1 is a block diagram showing the hierarchical structure of a typical microprocessor system.

A microprocessor board (of the type to be tested), illustrated in FIG. 1, consists of a central processing unit (CPU),

1, one or more bus expansion slots, 2, memory devices, 3, 4, 5, 6, and may typically include input/output (I/O) devices 7, 8, 9, 10, 11 and/or peripheral devices, e.g. disk drives. The top bus layer in the hierarchy is reserved for devices communicating at high speeds with the processor. In the present example, the processor, 1, and main memory 3, reside on the top layer.

The next bus layer in the hierarchy is the PCI (peripheral component interconnect) subsystem and this controls the faster I/O devices, such as video adapters, 10. Connections are also provided at this layer in the form of bus slots, 2, for connecting further expansion boards to the system.

A further bus layer is the ISA (industry standard architecture) subsystem. The ISA subsystem controls the slower I/O devices, examples of which include mouse, keyboard, serial port etc. Bus slots may also be provided in this layer to provide for connection of expansion boards to the system. Other bus layers of a system may include PMC, Compact PCI, PC/104 and AGP, which may or may not have bus slots provided for connection of boards.

The various layers of a system are connected by means of devices called bridges 12, 13. These bridges act as interfaces between the standard protocols of the different busses, to facilitate communication between the various layers of the system hierarchy.

Figure 2:
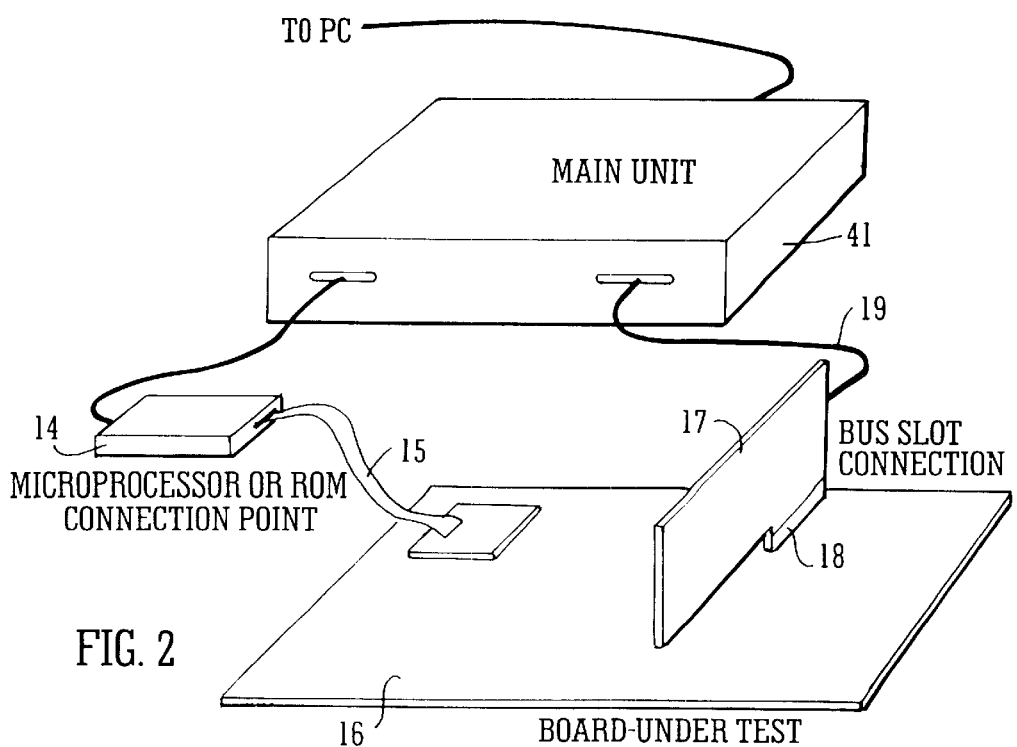
FIG. 2 shows a pictorial view of a bus monitoring system arranged according to one embodiment of the invention.

An electronic test system according to one embodiment of the invention as shown in FIG. 2 comprises an interface circuit in the form of a ROM or microprocessor emulation circuit, 14, connected via cable, 15, to the UUT (unit under test), 16, and a bus monitor interface device (board/circuit), 17, connected to the unit under test using a bus slot, 18, on the UUT. The bus monitor board/circuit is connected to the main test circuitry, unit 41, via a short cable, 19.

Test signals are sent from test system main unit 41 via a ROM or microprocessor emulation circuit, 14, to the unit under test, 16, and responses are obtained from the bus monitoring system, 18. The use of ROM or processor emulation systems to send test signals is well known in the art, e.g. Irish Patent Application No. 1576/89. These responses can be compared with normal responses to highlight errors and/or presented to a test system user by means of a suitable graphical interface available on a PC or other suitable display means, such a display facility being associatable with unit 41 as required.

A simple example of such a test is the placing of an all ones signal on the data bus by a ROM/microprocessor emulator. This signal is sampled at the bus slot by the bus monitor circuitry. Any lines of the data bus which are not measured as a one highlight a fault, possibly a "stuck bit". A "stuck bit" or "stuck" is where a line remains in a permanent high (one) or low (zero) state. A frequent cause of "stucks" is shorts to ground or to the supply voltage in a circuit.

Figure 6:
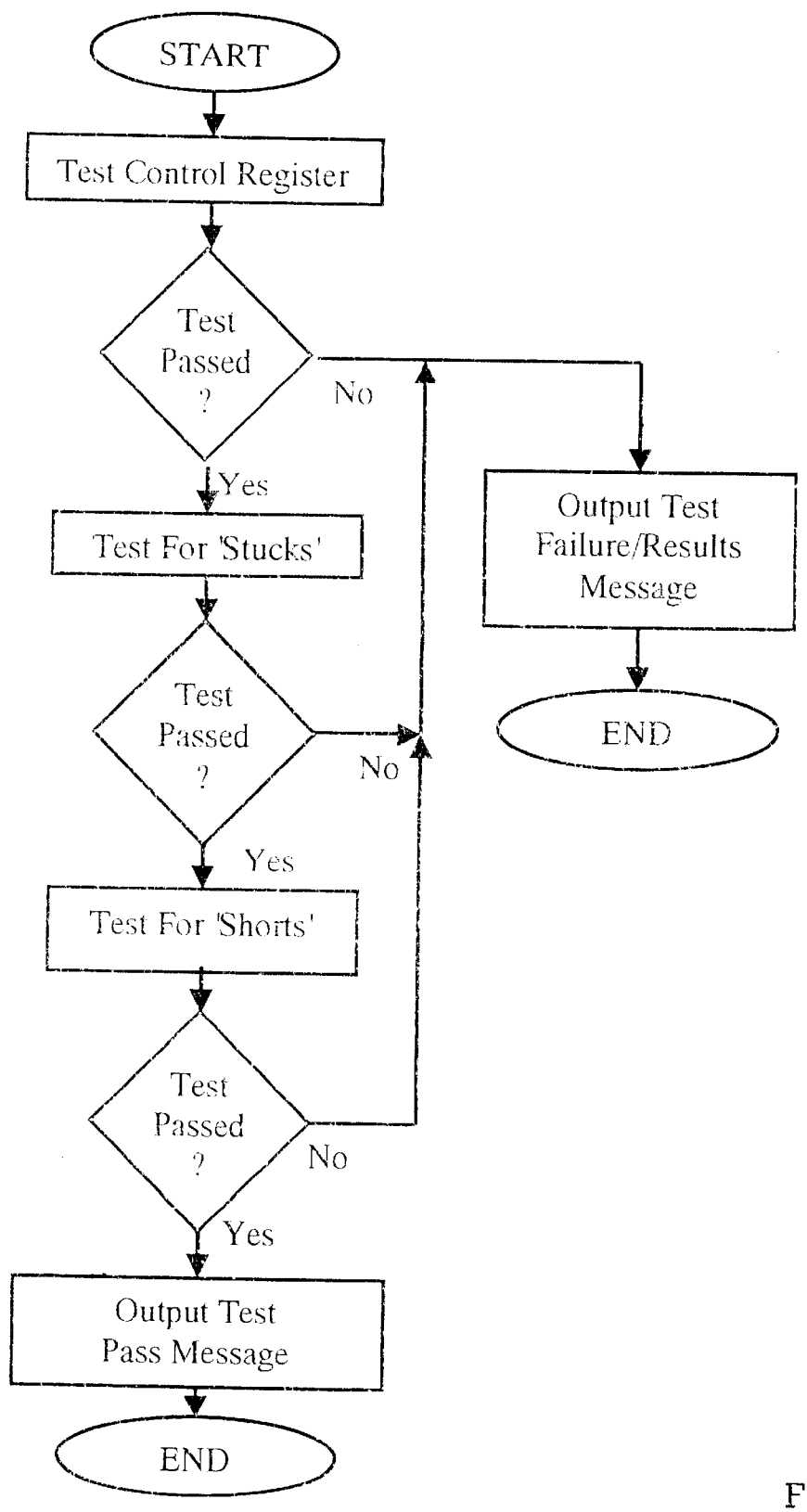
FIG. 6 is a flow chart of a typical test for use with the bus monitor circuit.

In general, a series of tests are arranged in a specific order to find an error. An example of a typical test sequence, shown in FIG. 6, initially tests the control lines. If the circuit under test passes this initial test, then the test system tests first for "stucks" and subsequently "shorts". If the circuit under test fails any of these tests, the test system notifies the operator/technician. This notification may be a simple indicator of whether the circuit under test passes a series of test or an individual test, e.g. by means of an LED, or alternatively a more comprehensive message may be provided on a computer screen or printout to assist the operator/technician in locating the fault, e.g. by identifying the device most likely to have failed, by identifying particular locations in the circuit to be probe tested using a handheld probe, or by indicating the actual faulty signal detected.

As the bus tests do not rely on peripheral devices being switched on, this testing can be used with plug-and-play devices/systems, particularly defective ones, to determine the integrity of the buses. After testing the buses, the peripheral devices may s be tested. If they fail to power up following successful bus testing, the failure is more likely to be in the peripheral device itself, since the bus monitor found no fault. Previously, test systems were unable to determine whether a fault was due to a failure in a peripheral device or in a bus without using a hand held probe or other such device, which as mentioned above is extremely time consuming.

Figure 3:
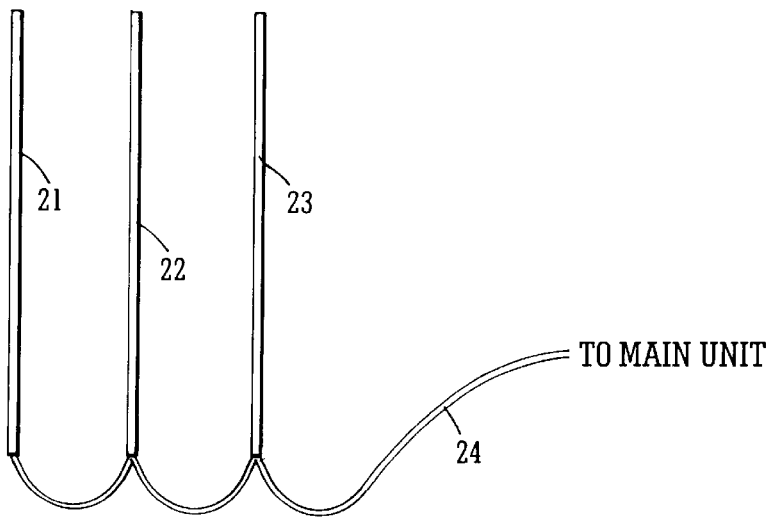
FIG. 3 shows an exemplary configuration of three bus cards.

Several bus cards, 21, 22, 23, each defining a device coresponding to item 17 of FIG. 2, may be connected simultaneously by a single cable, 24, to the system main unit 41 to improve the speed and efficiency of the testing process, as illustrated in FIG. 3. Each card is used to test a separate bus. In this way, the PCI and ISA bus layers may be tested in the same session without any intervention by a technician being required to move connections or change switch settings, etc. Each card may be connected individually to the test system or by way of a common cable such as cable 24. In the latter case, each card is assigned a unique address by means of one or more switches on the card. This address assignment permits individual card identification. Each additional switch increases the number of addresses and hence the number of cards that may be connected by a factor of two. For example, if four switches are used, then 16 cards may be connected simultaneously.

The internal circuitry of a bus card will be similar regardless of the bus type (e.g. ISA, PCI, etc.) being tested, the main difference between cards for different layers or systems being the size and arrangement of the bus slot connector, or other connection means, as well as which small changes may be present in the bus capture unit.

Figure 4:
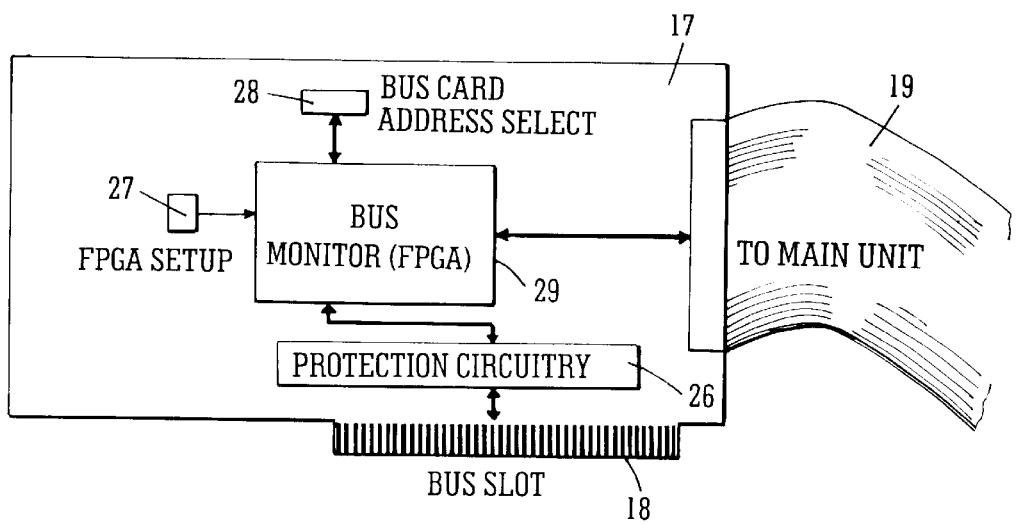
FIG. 4 is a block diagram of a bus test card.

A typical circuit configuration for a bus test card, 17, is illustrated in FIG. 4. The connection to the circuit under test is made by the bus slot connector, 18. Protection circuitry, 26, ensures that a bus test card is not damaged when plugged into a faulty circuit. The bus monitor is implemented using a FPGA, 29, (Field Programmable Gate Array). A FPGA is a re-configurable device, i.e. its internal hardware structure can be changed by changing the associated FPGA set-up component, 27, which is also located on the bus test card.

In operation, a control signal is sent from the main test apparatus 41 via cable, 19. This identifies the address of the particular bus test card requested. The FPGA circuit is only activated when the address identified by the main test apparatus matches the bus test card switch settings, 28.

Figure 5:
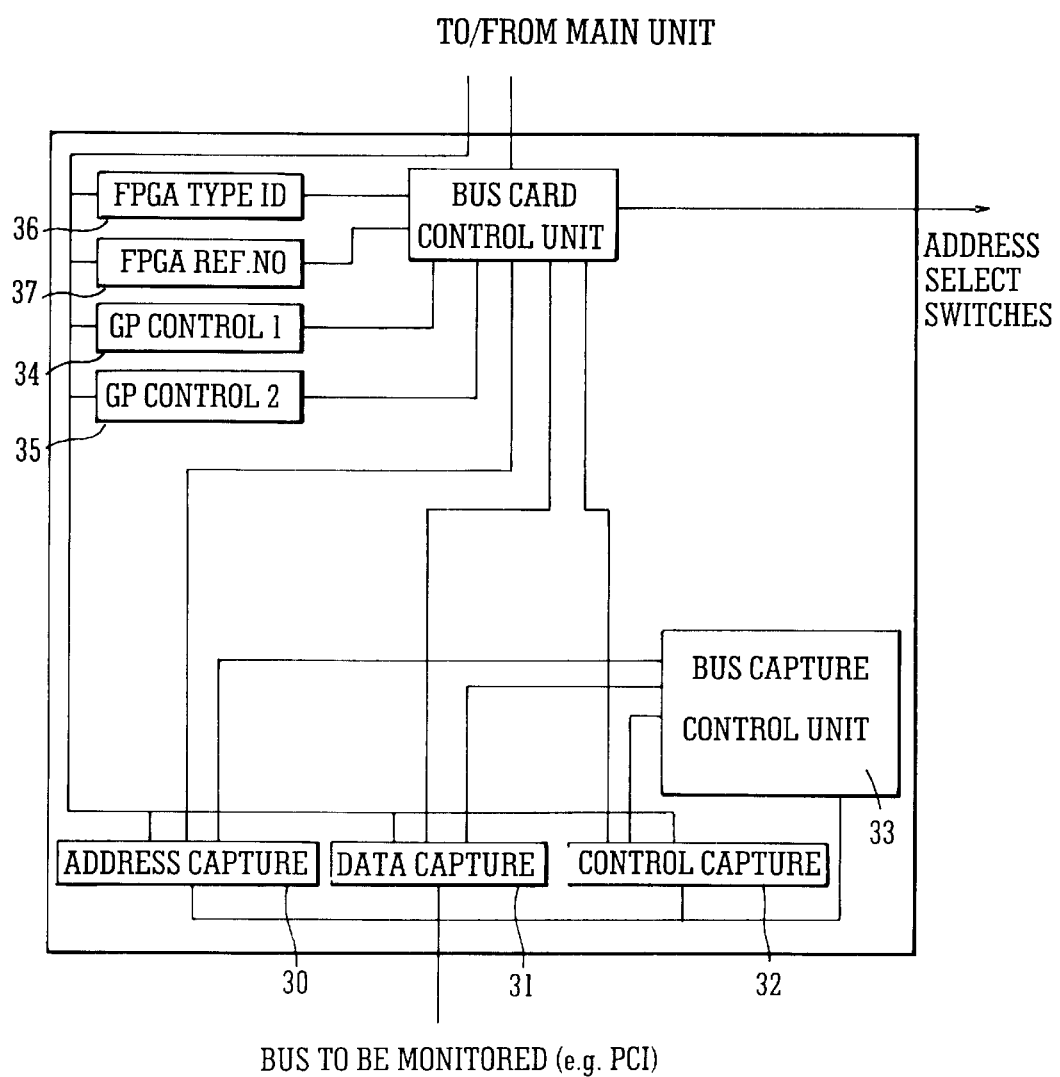
FIG. 5 is block diagram of the bus monitor circuit of FIG. 4.

Data may be sent to and received from the bus test card by the test apparatus. The flow of data is determined by control codes sent from the main test apparatus to the bus card control unit. The control unit controls the operation of the various elements on the bus test card and directs which elements should perform what function and when. Referring now to FIG. 5, in which an embodiment of bus monitor circuitry 29 of the invention is shown, the data from the data bus, the address bus or the control bus is capturable using the data, address and control capture circuits, 30, 31, 32. These capture circuits take a snapshot picture of the data on the respective bus at any particular instant. The bus capture control unit, 33, controls the operation of the capture circuits, determining when a "snapshot" should be taken and for which bus. The captured data may then be sent to the test system for analysis and/or display.

Two further registers, GP Control 1 & 2, 34, 35, are general purpose read/write registers for controlling miscellaneous functions within the FPGA and in particular for allowing dynamic modification of the operation of the FPGA, for example by providing a means for the reconfiguring the data capture circuits as data output devices to place data on a bus. This dynamic facility allows the bus test card to be reconfigured for different tests, without having to reprogram the actual FPGA matrix, which would require resetting the FPGA.

The use of a configurable device such as an FPGA permits the simple addition of new hardware and software features to a bus test card whenever extra tests or capabilities are required. It will however be readily appreciated by anybody skilled in the art that a bus test card may also be implemented using devices other than an FPGA, e.g. a combination of memory and logic circuit elements.

Each bus test card may also contain "identifiers", examples of which may include a FPGA Type ID, 36 and FPGA Rev. No., 37. The FPGA Type ID is a read only number identifying the type of bus card, i.e. whether it is for testing PCI, ISA etc. The FPGA Rev. No. is used to identify the FPGA version the bus card contains. Thus software may test a bus test card to determine what tests the card is capable of carrying out and have it perform only these tests. Hence, old bus test cards may be used with newer versions of the software, thus allowing for easy introduction of newer versions of bus cards according as buses, tests and circuits are developed and introduced, in that the test software is not limited to specific card versions.

It will be readily appreciated by anybody skilled in the art that although the present invention has been described in terms of taking a snapshot of the data available on the buses at a particular instant, the circuitry may also be suitably modified to place a signal on the buses at any instant. Thus the bus monitoring circuit may be used for creating test signals as well as measuring the responses to test signals. This enables the generation of a test signal by a bus test card, for example a card connected to the ISA bus, and the measurement of the test signal by a further bus test card (or by a microprocessor gripper or other suitable device), for example connected to the PCI bus. Thus tests may be made between the various buses without using ROM or microprocessor emulation.

It will also be appreciated by anybody skilled in the art that the present invention with minor workshop variations may be used on a diversity of computer bus systems where a connection is available by bus slot or other suitable means.

What is claimed is:

1. An interface device for use with an electronic test system for testing a circuit board including a processor and a bus, the interface device comprising:

first communicating means for communicating between the circuit board and the electronic test system, wherein said first communicating means includes an interface circuit and a connector for connecting the interface circuit to the circuit board at a first location, and second communicating means for communicating between the electronic test system and the circuit board, wherein the second communicating means includes bus access-enabling means for connecting to the bus of the circuit board at a second location physically removed from the first location, wherein the interface circuit is responsive to instructions received from a command means of the electronic test system to communicate data to the circuit board at the first location, and wherein the second communicating means receives response data at the second location on the circuit board in response to the data communicated by the interface circuit to the circuit board at the first location.

2. The interface device according to claim 1, wherein said bus access-enabling means comprises connection means for connecting to a bus of the circuit board under test.

3. The interface device according to claim 2, wherein the connection means comprises a bus slot connector.

4. The interface device according to claim 1, wherein the interface circuit comprises at least one of a ROM emulation circuit and a microprocessor emulation circuit.

5. The interface device according to claim 1, wherein the second communicating means comprises a bus monitoring circuit.

6. A method of testing an electronic circuit including a microprocessor, the method comprising the steps of (a) generating a test signal, (b) applying said test signal to a first location of the circuit under test, and (c) measuring the response of the circuit under test to said test signal at a location of the circuit under test different from said first location, at least one of said locations enabling access to a bus of the circuit under test.

7. The method according to claim 6, wherein said test signal is applied via a ROM emulation circuit.

8. The method according to claim 6, wherein said test signal is applied via a microprocessor emulation circuit.

9. The method according to claim 6, wherein the step (c) of measuring the response further comprises measuring the response at connecting means for connecting to a bus of the circuit under test.

10. The method according to claim 9, wherein the connecting means comprises a bus slot connector.

11. The method according to claim 6, further comprising processing the response for display of test results.

12. The method according to claim 11, wherein said processing of the response is implemented at least in part by at least one FPGA.

13. Electronic test apparatus for testing an electronic circuit including a microprocessor, the electronic test apparatus comprising:

(a) a least first and second means enabling access to a circuit under test, (b) means for generating a test signal, (c) means for applying said test signal to said first access-enabling means, and (d) means for measuring, at said second access-enabling means, the response of the circuit under test to said test signal applied at said first access-enabling means, wherein at least one of said access-enabling means enables access to a bus of the circuit under test, and wherein said first access enabling means is located at a first location and said second access enabling means is located a second location physically separated from said first location.

14. The electronic test apparatus according to claim 13, wherein one of said first and second access-enabling means comprises connection means for connecting to the circuit under test.

15. The electronic test apparatus according to claim 14, wherein the connection means comprises a ROM emulation circuit.

16. The electronic test apparatus according to claim 14, wherein the connection means comprises a microprocessor emulation circuit.

17. The electronic test apparatus according to claim 13, wherein said first access-enabling means comprises connection means.

18. The electronic test apparatus according to claim 17, wherein the connection means comprises a ROM emulation circuit.

19. The electronic test apparatus according to claim 17, wherein the connection means comprises a microprocessor emulation circuit.

20. The electronic test apparatus according to claim 13, wherein said second access-enabling means comprises connection means for connecting to a bus of the circuit under test.

21. The electronic test apparatus according to claim 20, wherein the connection means comprises a bus slot connector.

22. The electronic test apparatus according to claim 13, wherein said second access-enabling means comprises a bus monitoring circuit.

23. The electronic test apparatus according to claim 22, wherein said bus monitoring circuit comprises a data capture circuit.

24. The electronic test apparatus according to claim 22, wherein said bus monitoring circuit is implemented as at least one FPGA.

25. The electronic test apparatus according to claim 13, further comprising means for displaying test results.

* * * * *